(12) United States Patent
Kwon

(10) Patent No.: US 6,404,680 B1
(45) Date of Patent: Jun. 11, 2002

(54) CIRCUIT TO CHECK OVERERASING OF REPAIR FUSE CELLS

(75) Inventor: Oh Won Kwon, Kyungki-Do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/468,933

(22) Filed: Dec. 22, 1999

(30) Foreign Application Priority Data

Dec. 28, 1998 (KR) .............................................. 98-59344

(51) Int. Cl.$^7$ .............................................. G11C 16/04
(52) U.S. Cl. .............................. 365/185.3; 365/185.09; 365/200
(58) Field of Search ........................... 365/200, 185.22, 365/185.3, 185.09

(56) References Cited

U.S. PATENT DOCUMENTS

| | | | |
|---|---|---|---|
| 5,233,562 A | 8/1993 | Ong et al. ................... 365/218 |
| 5,745,410 A | 4/1998 | Yiu et al. ................. 365/185.3 |
| 5,748,538 A | 5/1998 | Lee et al. ............... 365/185.06 |
| 5,774,396 A | * 6/1998 | Lee at al. ............... 365/185.09 |
| 5,822,252 A | 10/1998 | Lee et al. ............... 365/185.06 |
| 5,856,944 A | 1/1999 | Prickett, Jr. et al. .... 365/185.29 |
| 5,856,945 A | 1/1999 | Lee et al. ............... 365/185.06 |

FOREIGN PATENT DOCUMENTS

| | | |
|---|---|---|
| EP | 0 199 075 A1 | 10/1986 |
| EP | 0 209 913 A2 | 1/1987 |
| JP | 7-122091 | 5/1995 |

* cited by examiner

Primary Examiner—Vu A. Le
(74) Attorney, Agent, or Firm—Pennie & Edmonds LLP

(57) ABSTRACT

The present invention comprises a first means to select all repair fuse cells, using a test mode, and to sense each repair fuse cell state depending on the applied read-out voltage; a logical means to generate decision signals to decide the overerasing state of said repair fuse cells by logically combining sensed signals from said each repair fuse cell; and a second means to read output signals of said logical means.

7 Claims, 5 Drawing Sheets

CIRCUIT TO CHECK OVERERASING OF REPAIR FUSE CELLS

BACKGROUND OF THE INVENTION

1. Field of the Invention

The present invention relates to a circuit to check overerasing of repair fuse cells, and more particularly to a method and a circuit to check overerasing of repair fuse cell for checking the overerasing state of fuse cells by sensing the current flowing in the fuse cells at the state to apply 0V to gates of all fuse cell and a uniform voltage to the drain, entering the sensing output to the logical gate and reading the output of the logical gate through an input/output pad.

2. Description of the Prior Art

Programming repair fuse cells allows repairing defective cells. Then the initial fuse cells should have been erased, and the threshold voltage of the cells should also be adjusted low with enough margins. Where the initial fuse cells were programmed, the normal cells will be repaired since the fuse cells were programmed although the normal cells did not need repairing. Thus undesirable repair occurs so that redundant cells for repairing are reduced.

On the other hand, the threshold voltage of the initial fuse cells should be low enough to remove the problem to cause inferiority by access to the redundant cells for repairing to act differently from the main array cells by programming by charge gain of fuse cells that may be generated during testing under some adverse conditions. Accordingly, at the early stage of testing, the fuse cells for repairing should be erased. and the threshold voltage should also be adjusted low. For the process, a circuit to check whether fuse cells are erased and, at the same time, to adjust the threshold voltage of the cells to be low enough is needed.

SUMMARY OF THE INVENTION

Accordingly, it is an object of the present invention to provide a circuit to check overerasing of repair fuse cells which can check whether the repair fuse cells are erased, and can adjust the threshold voltage of cells to be low enough at the same time.

The present invention to achieve the above objects comprises: a first means to select all repair fuse cells using a test mode and to sense the repair fuse cell state respectively in accordance with the applied read-out voltage; a logical means to generate decision signals to decide the overerasing state of said repair fuse cells by logically combining the sensed signals from each repair fuse cells; and a second means to read output signals of said logical means.

It is to be understood that both the foregoing general description and the following detailed description are exemplary and explanatory and are intended to provide further explanation of the invention as claimed.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DETAILED DESCRIPTION OF THE PREFERRED EMBODIMENTS

Reference will now be made in detail to the preferred embodiments of the present invention, and examples of which are illustrated in the accompanying drawings.

Figure 1:
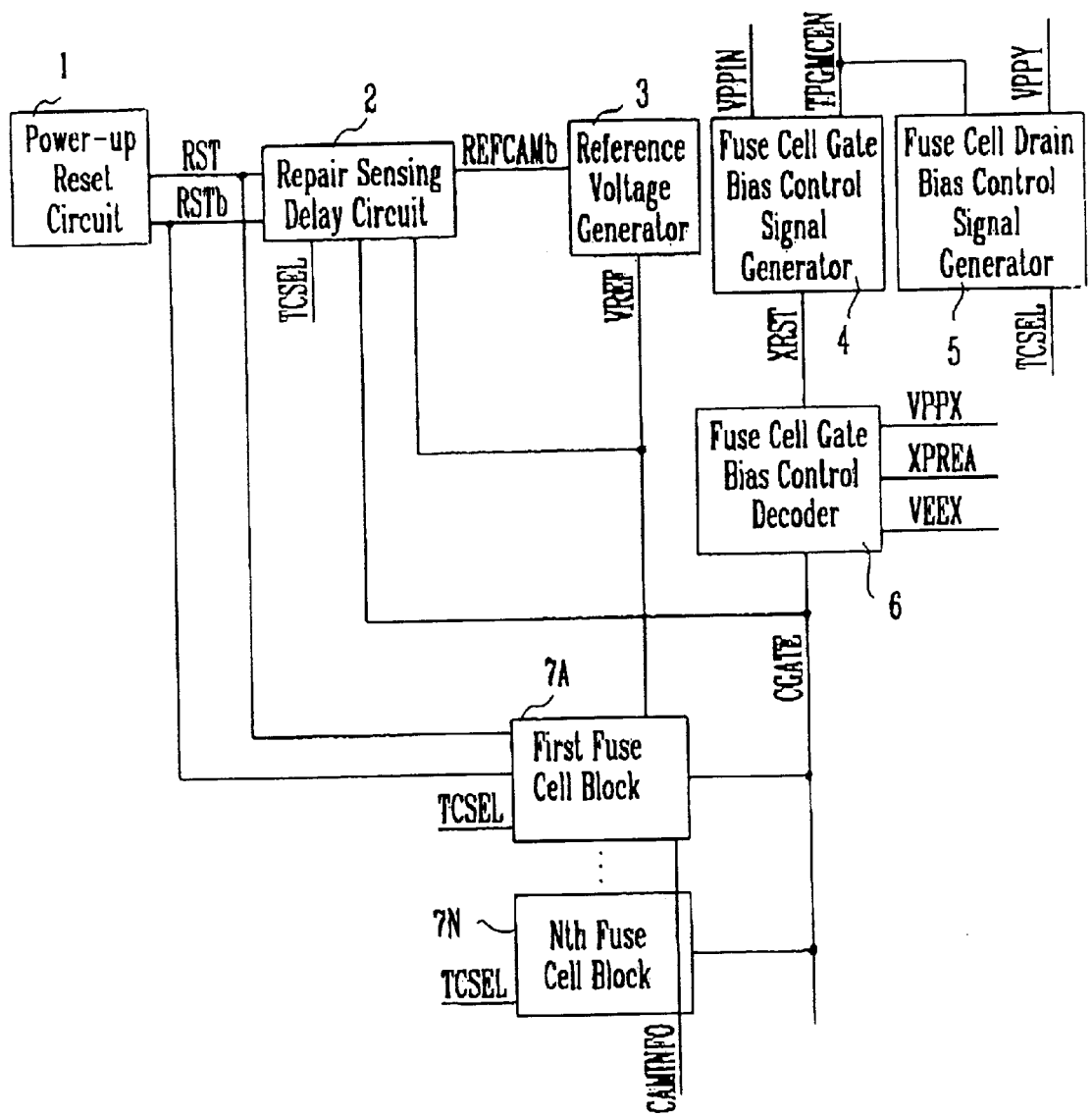
FIG. 1 is a block diagram to show the relation of a fuse cell block and the peripheral circuits to apply the present invention.

FIG. 1 is a block diagram to show the relation of a fuse cell block and peripheral circuits to apply the present invention.

A power-up reset circuit 1 generates a reset signal RST an inverted reset signal RSTb at any moment after supplying the supply voltage $V_{CC}$ and they are entered to the repair data sending delay circuit 2 and the fuse cell blocks 7A to 7N. The circuit to check overerasing of repair fuse cells in accordance with the present invention is located in the fuse cell blocks 7A to 7N.

The repair data sensing delay circuit 2 outputs the reference fuse cell signal REFCAMb by entering the reset signal FST and the inverted reset signal RSTb from the power-up resent circuit 1, the reference voltage VREF from the reference voltage generator 3, and the fuse cell gate signal CGATE from the fuse cell gate bias control decoder 6.

The reference voltage generator 3 generates the reference voltage VREF according to the reference fuse cell signal REFCAMb from the repair data sensing delay circuit 2 and the reference voltage VREF is inputted to the fuse cell blocks 7A to 7N.

The fuse cell gate bias control signal generator 4 generates the fuse cell reset signal XRST which is apply to the fuse cell gate bias control decoder 6 according to the first power VPPIN to apply the read-out voltage and the program voltage and the cell program enable signal TPGMCEN.

The fuse cell drain bias control signal generator 5 generates the fuse cell select signal TCSEL according to the second power VPPIY to apply the read-out voltage and the program voltage, and the cell program enable signal TPGMCEN, and allows the signal TCSEL entered to the fuse cell blocks 7A to 7N.

The fuse cell gate bias control decoder 6 generates the fuse cell gate signal CGATE according to the third power VPPX to apply the program voltage and read-out voltage, the fourth power VEEX to supply decoder signals XPREA and erasing voltage, and fuse cell reset signals XRST, and then outputs the signal(GATE) to the repair data sensing delay circuit 2 and the fuse cell blocks 7A to 7N. The decoder signal XPREA, the program and the read-out bias enable signal, is that the cell erasing enable signal TERACEN, the fuse cell verify signal TCAMVERIFYr and the reference fuse cell signal REFCAMb are logically combined by the NOR gate.

The fuse cell blocks 7A to 7N include the circuit to check overerasing of repair fuse cells in accordance with the present invention, and display the result after verifying the cell status according to multiple signals as described above.

Figure 2:
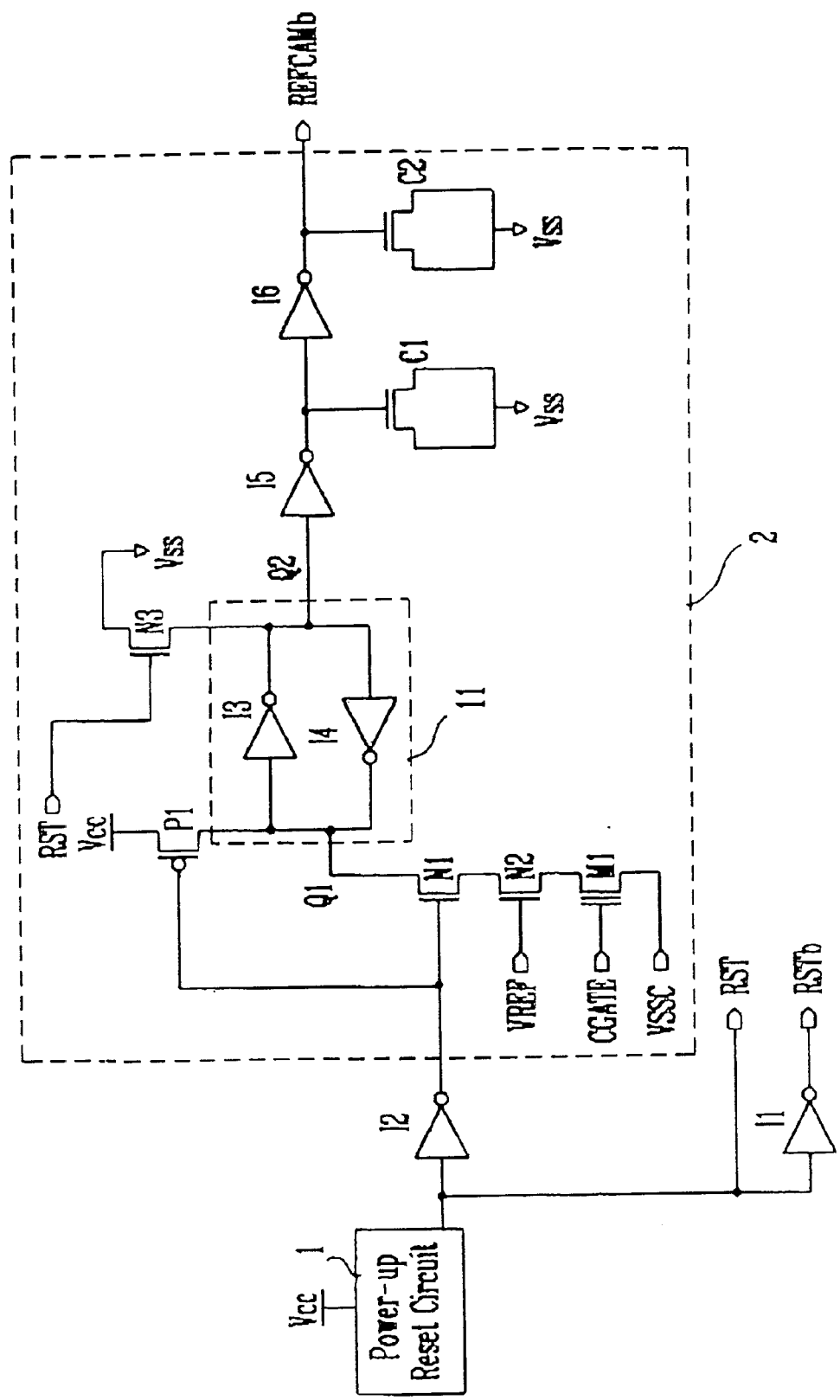
FIG. 2 is a detailed circuit diagram of a power-up reset circuit and a repair data sensing delay circuit in FIG. 1.

FIG. 2 is a detailed circuit diagram of a power-up reset circuit and a repair data sensing delay circuit in FIG. 1.

A first NMOS transistor N1 of the repair data sensing delay circuit 2 is connected between a latch circuit 11 and a second NMOS transistor N2, and operates by the inverted reset signal RSTb outputted from the power-up reset circuit 1. A first PMOS transistor P1 is connected between a power terminal and the latch circuit 11, and operates by the inverted reset signal RSTb. The second NMOS transistor N2 is connected between the first NMOS transistor N1 and the fuse cell M1, and operates by the reference voltage VREF generated from the reference voltage generator 3. The fuse cell M1 is connected to a second NMOS transistor(N2); the fuse cell gate signal CGATE is entered to the gate electrode of the fuse cell M1; and the fifth power VSSC is supplied to a drain electrode of the fuse cell. The latch circuit connected between the first PMOS transistor P1 and the first NMOS transistor N1 comprises third and fourth inverters I3 and I4, and latches input data. A third NMOS transistor N3 connected between the latch circuit 11 and the ground terminal $V_{SS}$ operates by the reset signal RST from the power-up reset circuit 1. The data latched to the latch circuit 11 are entered to the reference voltage generator 3 after being delayed by the 2 stage RC delay circuit composed by a fifth inverter I5 and a first capacitor C1, a sixth inverter I6 and a second capacitor C2. That is the delay circuit outputs a reference cell signal REFCAMb.

A method to drive a repair data sensing delay circuit constituted as described above is described in the following with reference to waveforms in FIG. 3.

Figure 3:
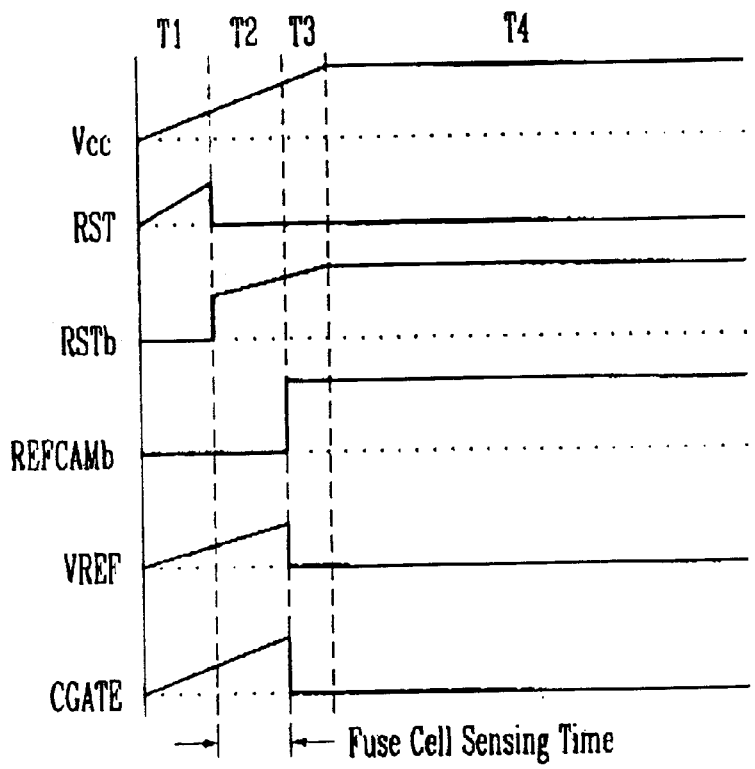
FIG. 3 is waveforms for explaining FIG. 2.

At the time of power-up as shown in T1 of FIG. 3, a reset signal RST is generated from the power-up reset circuit 1 at any time after applying supply voltage $V_{CC}$. The reset signal RST is inverted to the low state RSTb by the second inverter I2 and applied to the gate of the first NMOS transistor N1 and the first PMOS transistor P1. Thus, the first NMOS transistor N1 is turned off, but the first PMOS transistor P1 is turned on. Then, since the fuse cell M1 keeps the initial erasing state, supply voltage $V_{CC}$ is applied via the first PMOS transistor P1 and a first node Q1 keeps the high state. Since the potential of the first node Q1 is inverted to the low state via the third inverter I3 of the latch circuit 11, the second node Q2 becomes the low state. However, a third NMOS transistor N3 is turned on by the high reset signal RST, and thus the potential of the second node Q2 keeps the low state. The low potential of the second node Q2 is delayed for a specified time by the 2(two) state RC delay circuit of the fifth inverter I5 and the first capacitor C1, the sixth inverter I6 and the second capacitor C2, and then outputted at the low state. This signal is entered to the reference voltage generator 3 as a reference fuse cell signal REFCAMb. The reference voltage generator 3 generates the reference voltage VREF and allows the voltage entered to the second NMOS transistor N2. Also, the potential of the fuse cell gate signal CGATE inputted to a gate of the fuse cell M1 rises by the applied supply voltage $V_{CC}$.

As shown in T2 of FIG. 2, the reset signal RSTb inverted of the second inverter I2 continuously rises where supply voltage $V_{CC}$ is continuously applied and the reset signal RST becomes the low state by stopping reset operation in the power-up reset circuit 1. The inverted reset signal RSTb turns on the first NMOS transistor N1 and turns off the first PMOS transistor P1. Thus, potential of the first node Q1 is inverted to a low state from high state and delayed for a specified time through the RC delay circuit. The output of the RC delay circuit becomes a high state. This signal is entered to the reference voltage generator 3 as a reference fuse cell signal REFCAMb; removes the continuously rising reference voltage VREF; allows the reference voltage VREF to be entered to the gate of the second NMOS transistor N2; and then turns off the second NMOS transistor N2. Also, the potential of the fuse cell M1 gate signal CGATE entered the gate of the fuse cell M1 continuously rises with the applied supply voltage $V_{CC}$, but the signal CGATE gets to the low state after receiving the reference fuse cell signal REFCAMb, and stops sensing.

T3 and T4 in FIG. 3 show the interval to finish all repair cell sensing, and thus sensing is performed at the early state of power-up as the advantage of the present invention.

Figure 4:
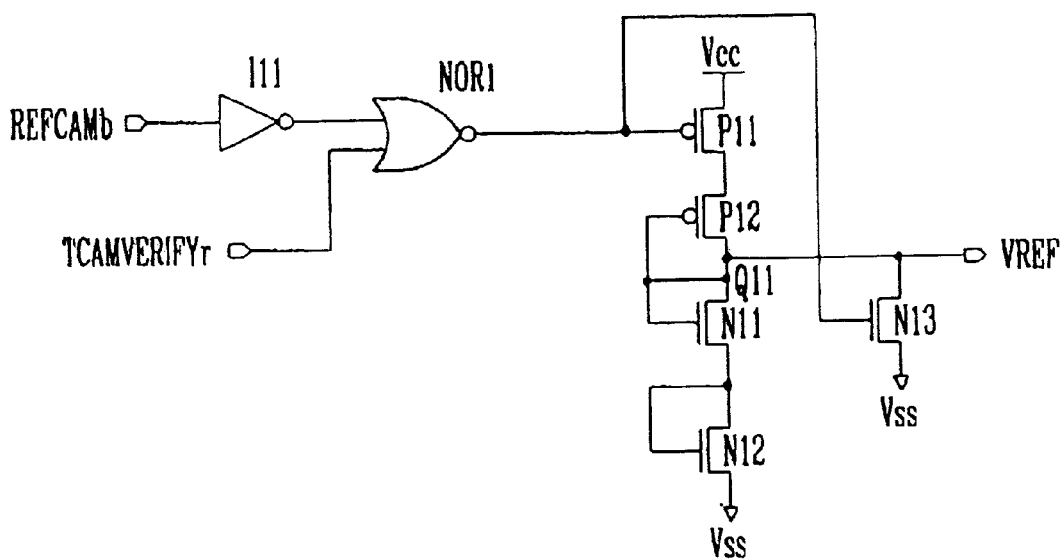
FIG. 4 is a detailed circuit diagram of a reference voltage generator in FIG. 1.

FIG. 4, as a detailed circuit diagram of the reference voltage generator in FIG. 1, is constituted as described below.

A first inverter I11 inverts the reference fuse cell signal REFCAMb from the repair data sensing delay circuit 2. The NOR gate NOR1 logically combines output signals of the first inverter I11 and the fuse cell verify signal TCAMVERIFYr. The first PMOS transistor P11 is connected between the power terminal and the second PMOS transistor P2, and operates by the output signal of the NOR gate NOR. The second PMOS transistor P12 is connected between the first PMOS transistor P11 and the output node Q11, and operates by the potential of the output node Q11. The first NMOS transistor N11 is connected between the output node Q11 and the second NMOS transistor N12, and operates by the potential of the output node Q11. The second NMOS transistor N12 is connected between the first NMOS transistor N11 and the ground terminal $V_{SS}$, and operates by the potential flowing through the first NMOS transistor N11. The third NMOS transistor N13 is connected between the output node Q11 and the ground terminal $V_{SS}$, and operates to output signals of the NOR gate NOR1.

A method to drive the reference voltage generator constituted as above is described below.

The reference fuse cell signal REFCAMb having a low state from the repair data sensing delay circuit 2 is inverted by a first inverter I11 at a high state and applied to the NOR gate NOR1. The fuse cell verify signal TCAMVERIFYr having a low state is entered to the other input terminal of the NOR gate NOR1 and the signal having a low state is outputted at an output terminal of the NOR gate NOR1. The signal having a low state turns on the first PMOS transistor P11 and turns off the third NMOS transistor N13. Thus, the first PMOS transistor P11, the second PMOS transistor P12, the first NMOS transistor N11 and the second NMOS transistor N12 are turned on and an uniform voltage VREF is generated.

The reference fuse cell signal REFCAMb having a high state from the repair data sensing delay circuit 2 is inverted by the first inverter I11 at a low state and then applied to the NOR gate NOR1. The fuse cell verify signal TCAMBERIFYr having a low state is entered to the other input terminal of the NOR gate NOR1 and the output of the NOR gate NOR1 becomes a high state. The signal having the high state turns off the first PMOS transistor P11 and turns on the third NMOS transistor N13. Then the potential of the output node Q11 keeps the ground voltage and the voltage is outputted as reference voltage VREF.

In starting a fuse cell testing, namely when the fuse cell verify signal TCAMVERIFYr is applied at the high state, the operation is described in the following. The reference fuse cell signal REFCAMb having a low state from the repair data sensing delay circuit 2 is inverted by the first inverter I11 at a high state applied to the NOR gate NOR1. The fuse cell verify signal TCAMVERIFYr having a high state is entered to the other input terminal of the NOR gate NOR1 and the output of the NOR gate NOR1 becomes a low state. The signal having low state turns on the first PMOS transistor P11 and turns off the third NMOS transistor N13. Thus supply voltage $V_{CC}$ is applied via the first PMOS transistor P11. Accordingly, the voltage to divide the rising supply voltage by the size ratio of a pull-up PMOS transistor and a pull-down NMOS transistor is outputted as the reference voltage $V_{ref}$.

The reference fuse cell signal REFCAMb having a high state from the repair data sensing delay circuit 2 is inverted by the first inverted I11 at a low state and applied to the NOR gate NOR1. The fuse cell verify signal TCAMVERIFYr having high state is entered to the other input terminal of the NOR gate NOR1 and the output of the NOR gate NOR1 becomes low state. The signal having a low state turns on the first PMOS transistor P11 and turns off the third NMOS transistor N13. Thus supply voltage $V_{CC}$ is applied via the turned-on first PMOS transistor P11.

As described above, in starting the fuse cell testing, that is, where a fuse cell verify signal TCAMVERIFYr is applied at the high state, the reference voltage VREF of uniform potential is outputted without regard to the reference fuse cell signal REFCAMb from the repair data sensing delay circuit 2. On the other hand, where fuse cell testing is not performed, the reference voltage VREF of uniform potential is generated by only when the reference fuse cell signal REFCAMb having the low state is applied at the low state.

Figure 5:
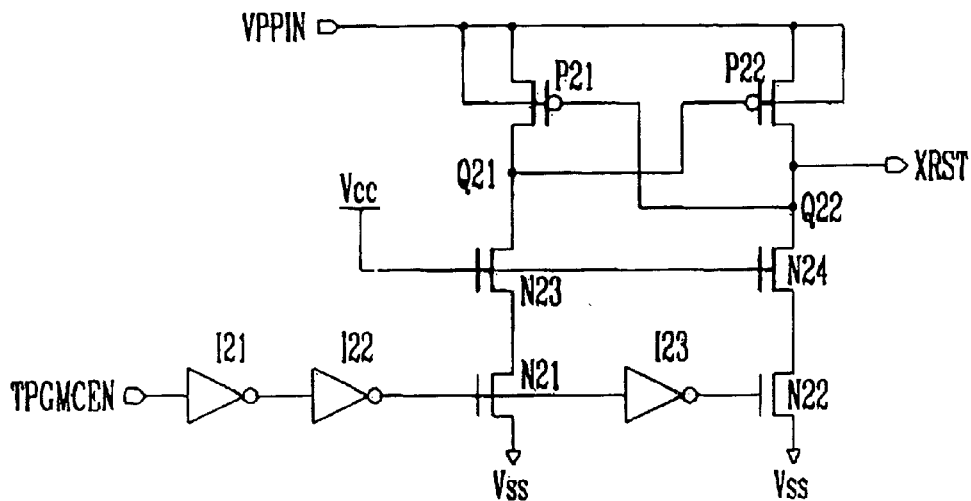
FIG. 5 is a detailed circuit diagram of a fuse cell gate bias control signal generator in FIG. 1.

FIG. 5, as a detailed circuit diagram of a fuse cell gate bias control signal generator, is constituted as described below.

The first PMOS transistor P21 is connected between the first power VPPIN to apply the read-out and program voltage, and the first node Q21, and operates by the potential of the second node Q21. The second PMOS transistor P22 is connected between the first power VPPIN and the second node Q22, and operates by the potential of the first node Q21. The third NMOS transistor N3 connected between the first node Q21 and the first NMOS transistor N21, and the fourth transistor N24 connected between the second node Q22 and the second NMOS transistor N22 always keep the turned-on state since supply voltage $V_{CC}$ is applied to the gate terminal of the NMOS transistor N23 and N24. The first NMOS transistor N21 is connected between the third NMOS transistor N23 and the ground terminal $V_{SS}$, and operates by the cell program enable signal TPGMCEN. The second NMOS transistor N22 is connected between the fourth NMOS transistor N24 and the ground terminal $V_{SS}$, and operates by the cell program enable signal TPGMCEN inverted and delayed via the first, second and third inverters I21, I22 and I23. The reset signals XRSTs, are entered to the fuse cell gate bias control decoder 6.

A method to drive fuse cell gate bias control signal generator is constituted above is described below.

Supply voltage $V_{CC}$ is applied to each gate terminal of the third and fourth NMOS transistors N23 and N24 so that they are always keep the turned-on state. At this state, if the cell program enable signal TPGMCEN is applied at the high state via the first and second inverters I21 and I22 to program cell the first NMOS transistor N21 is turned and the second NMOS transistor N22 is turned off by the low signal inverted by the third inverter I23. Thus, as the first node Q21 keeps the low potential and the second PMOS transistor P22 is turned on, the second node Q22 keeps the high state by the supplied first power VPPIN. By the potential of the second node Q22 keeping the high state, the first PMOS transistor P21 is turned off, and the potential of the second node Q22 keeping the high state is outputted to the fuse cell bias control decoder 6 as a cell reset signal XRST. However, since the cell reset signal XRST is applied as the potential of pumping voltage VPPI for cell programming, the first power VPPIN should supply pumping voltage VPPI in programming.

Supply voltage $V_{CC}$ is applied to each gate terminal of the third and fourth NMOS transistors N23 and N24 so that they are always keep the turned-on state. At this state, if the cell program enable signal TPGMCEN is applied at the low state via the first and second inverters I21 and I22 to read or erase cells, the first NMOS transistor N21 and the second NMOS transistor N22 is turned on by the high signal inverted by the third inverter I23. Thus, as the second node Q22 keeps the low potential and the first PMOS transistor P21 is turned on, the first node Q21 keeps the high state by the supplied first power VPPIN. By the potential of the first node Q21 keeping high, the second PMOS transistor P22 is turned off, and the potential of the second node Q22 keeping low is outputted to the fuse cell bias control decoder 6 as a cell reset signal XRST.

Figure 6:
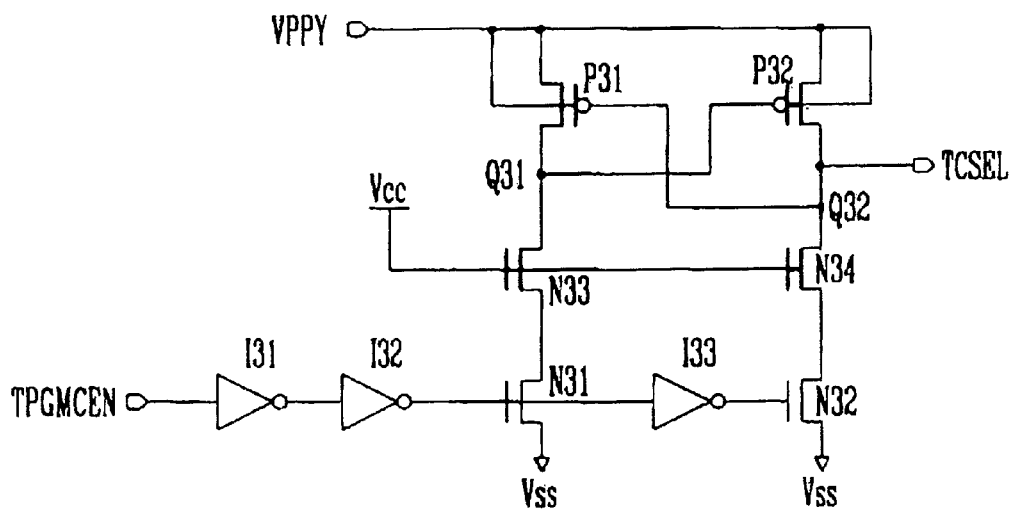
FIG. 6 is a detailed circuit diagram of the fuse cell drain bias control signal generator in FIG. 1.

FIG. 6, as a detailed diagram of a cell drain bias control signal generator, is constituted as described below.

The first PMOS transistor P31 is connected between the second power VPPY to apply the read-out and program voltage, and the first node Q31, and operates by the potential of the second node Q32. The second PMOS transistor P32 is connected between the second power VPPY and the second node Q32, and operates by the potential of the first node Q31. The third NMOS transistor N33 connected between the first node Q31 and the first NMOS transistor N31, and the fourth transistor N34 connected between the second node Q32 and the second NMOS transistor N32 always keep the turned-on state since supply voltage $V_{CC}$ is applied to the gate terminal.

The first NMOS transistor N31 is connected between the third NMOS transistor N33 and the ground terminal $V_{SS}$, and operates by the cell program enable signal TPGMCEN by the first and second inverters I31 and I32. The second NMOS transistor N32 is connected between the fourth NMOS transistor N34 and the ground terminal $V_{SS}$, and operates by the cell program enable signal TPGMCEN delayed and inverted via the first, second and third inverters I31, I32 and I33. The signals outputted by the above process, as fuse cell select signals TCSEL, are entered to the circuit to check overerasing of repair fuse cells, in accordance with the present invention, in the fuse cell blocks 7A to 7N.

A method to drive a fuse cell drain bias control signal generator constituted as above may be described below.

First, since supply voltage $V_{CC}$ is applied to each gate terminal of the third and fourth NMOS transistors N33 and N34 so that they are always keep the turned-on state. At this state, if the cell program enable signal TPGMCEN is applied at the high state via the first and second inverters I31 and I32 to program cells, the first NMOS transistor N31 is turned off and the second NMOS transistor N32 is turned on a low signal inverted by the third inverter I33. Thus, as the first node Q31 keeps low potential and the second PMOS transistor P32 is turned on, the second node Q32 keeps the high state by the supplied third power VPPY. By the potential of the second node Q32 keeping high, the first PMOS transistor P31 is turned off, and the potential of the second node Q32 keeping high is entered to the circuit to check overerasing of repair fuse cells as a fuse cell select signal TCSEL.

Supply voltage $V_{CC}$ is applied to each gate terminal of the third and fourth NMOS transistors N33 and N34 so that they are always keep the turned-on state. At this state, if the cell program enable signal TPGMCEN is applied at the low state via the first and second inverters I31 and I32 to read or erase cells, the first NMOS transistor N31 is turned off and the second NMOS transistor N32 is turned on the high signal inverted by the third inverter I33. Thus, as the second node Q32 keeps low potential and the first PMOS transistor P31 is turned on, the first node Q21 keeps high state by the supplied first power VPPY. By the potential of the first node Q31 keeping high state, the second PMOS transistor P32 is turned off, and the potential of the second node Q32 keeping low state is entered to the circuit to check overerasing of repair fuse cells as a fuse cells elect signal TCSEL.

Figure 7:
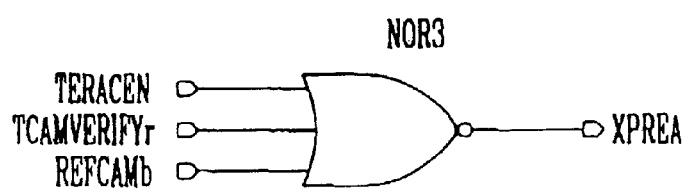
FIG. 7 is a circuit diagram to describe signal combination for generating fuse cell reset signals.

FIG. 7 shows logically to combine the cell erase enable signal TERACEN, the fuse cell verify signal TCAMVERIFYr and the reference fuse cell signal REFCAMb in the NOR gate NOR3, to generate the fuse cell reset signal XRST.

Figure 8:
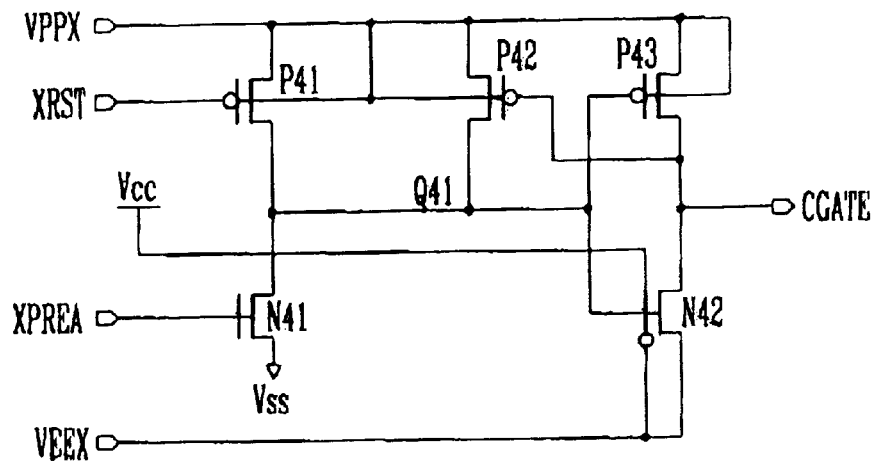
FIG. 8 is a circuit diagram of the fuse cell gate bias control decoder in FIG. 1.

FIG. 8, as a detailed circuit diagram of a fuse cell gate bias control decoder, is constituted as described below.

The first PMOS transistor P41 is connected between the third power VPPX and the first node Q41, and operates by the fuse cell reset signal XRST. The second PMOS transistor P42 is connected between the third power VPPX and the first node Q41, and operates by the potential of the output terminal CGATE. The third PMOS transistor P43 is connected between the third power VPPX and the output terminal CGATE, and operates by the potential of the first node Q41. The first NMOS transistor N41 is connected between the first node Q41 and the ground terminal $V_{SS}$, and operates by the decoder signal XPREA. The second NMOS transistor N42, that is, the triple well NMOS transistor, is connected between the fourth power VEEX and the output terminal CGATE, and operates by the supply voltage $V_{CC}$ and the fourth power VEEX. The signal outputted to the output terminal is a fuse cell gate signal CGATE.

Driving bias condition of a fuse cell gate bias control decoder constituted as described above are shown in the [Table 1]. A method to drive the decoder, using the conditions, is described in the following.

TABLE 1

|  | Program | Erase | Read | Fuse Cell Verify |
| --- | --- | --- | --- | --- |
| VPPX | VPPI | 2 V | Vcc | Vcc |
| XRST | VPPI | 0 V | 0 V | 0 V |
| VNWELL | Vcc | Vcc | Vcc | Vcc |
| XPREA | Vcc | 0 V | Vcc or 0 V | 0 V |
| VEEX | 0 V | −9 V | 0 V | 0 V |
| CGATE | VPPI | −9 V | Vcc | 0 V |

First, for the program mode operation, the third power VPPX keeps the positive pumping voltage VPPI level since the positive pump performs pumping. The fuse cell reset signal XRST rises to the positive pumping voltage VPPI level since the positive pump performs pumping from the 0V level. The fourth power VEEX keeps 0V, that is, the ground voltage $V_{SS}$. The decoder signal XPREA and the N-well voltage VNWELL keeps supply voltage $V_{CC}$ level, and thus the fuse cell gate signal CGATE keeps the pumping voltage VPPI level.

The first PMOS transistor P41 is turned off by the pumping voltage VPPI supplied from the fuse cell reset signal XRST. Since the decoder signal XPREA at the high state turns on the first NMOS transistor and thus a path is formed to the ground terminal, the first node Q41 gets to the low state. Respectively using the potential of the first node Q41 as input, the third PMOS transistor P43 is turned on and the second NMOS transistor N42 which is a triple well NMOS transistor is turned off. Therefore, pumping voltage VPPI is supplied to the output terminal, and the second PMOS transistor P42 is turned off by the supplied voltage, For the erase mode operation, the third power VPPX keeps 2V, the fuse cell reset signal XRST 0V, and the fourth power VEEX −9V. Since the decoder signal XPREA keeps 0V and the N-well voltage VNWELL does supply voltage $V_{CC}$, the fuse cell gate signal CGATE is kept at −9V.

As the decoder signal XPREA of 0V turns off the first NMOS transistor N41 and the fuse cell reset signal XRST of 0V turns on the first PMOS transistor P41, the first node Q41 keeps high since 2V is supplied by the third power VPPX. The second NMOS transistor N42 is turned on the third PMOS transistor P41 is turned off by the potential of the first node Q41 at the high state, and thus the output terminal keeps the potential of −9V supplied by the fourth power VEEX. The second PMOS transistor P42 is turned on by the potential of the output terminal keeping −9V, and thus the first node Q41 continuously keeps high.

For the read-out mode, the third power VPPX keeps the voltage of supply voltage $V_{CC}$, the fuse cell reset signal XRST 0V, and the fourth power VEEX 0V. Since the decoder signal XPREA keeps supply voltage $V_{CC}$ or 0V, and the N-well voltage VNWELL the supply voltage $V_{CC}$ level, thus the fuse cell gate signal CGATE keeps supply voltage $V_{CC}$.

The first node Q41 keeps low since the first NMOS transistor N41 is turned on with the supply voltage $V_{CC}$ supplied by the decoder signal XPREA, and the first PMOS transistor P41 is turned on by the fuse cell reset signal XRST of 0V. The second NMOS transistor N42 is turned off and the third PMOS transistor P43 is turned on by the low potential of the first node Q41, and thus the output terminal keeps the potential of supply voltage $V_{CC}$ supplied by the third power VPPX. As the second PMOS transistor P42 is turned off by the potential of the output terminal keeping supply voltage $V_{CC}$, the first node Q41 continuously keeps low.

For fuse cell verify mode, the third power VPPX keeps supply voltage $V_{CC}$, the fuse cell reset signal XRST 0V, the fourth power VEEX 0V. Since the decoder signal XPREA keeps 0V and the N-well voltage VNWELL the supply voltage $V_{CC}$ level, thus 0V is kept for the fuse cell gate signal CGATE.

Since the first NMOS transistor N41 is turned off by the decoder signal XPREA of 0V and the first PMOS transistor P41 is turned on by the fuse cell reset signal XRST of 0V, the first node Q41 keeps high as the third power VPPX applies supply voltage $V_{CC}$. The second NMOS transistor N42 is turned on and the third PMOS transistor P43 is turned off by the high potential of the first node Q41, and thus the output terminal keeps 0V by the fourth power VEEX. As the second PMOS transistor P42 is turned on by the potential of the output terminal keeping 0V, the first node Q41 continuously keeps high.

Figure 9:
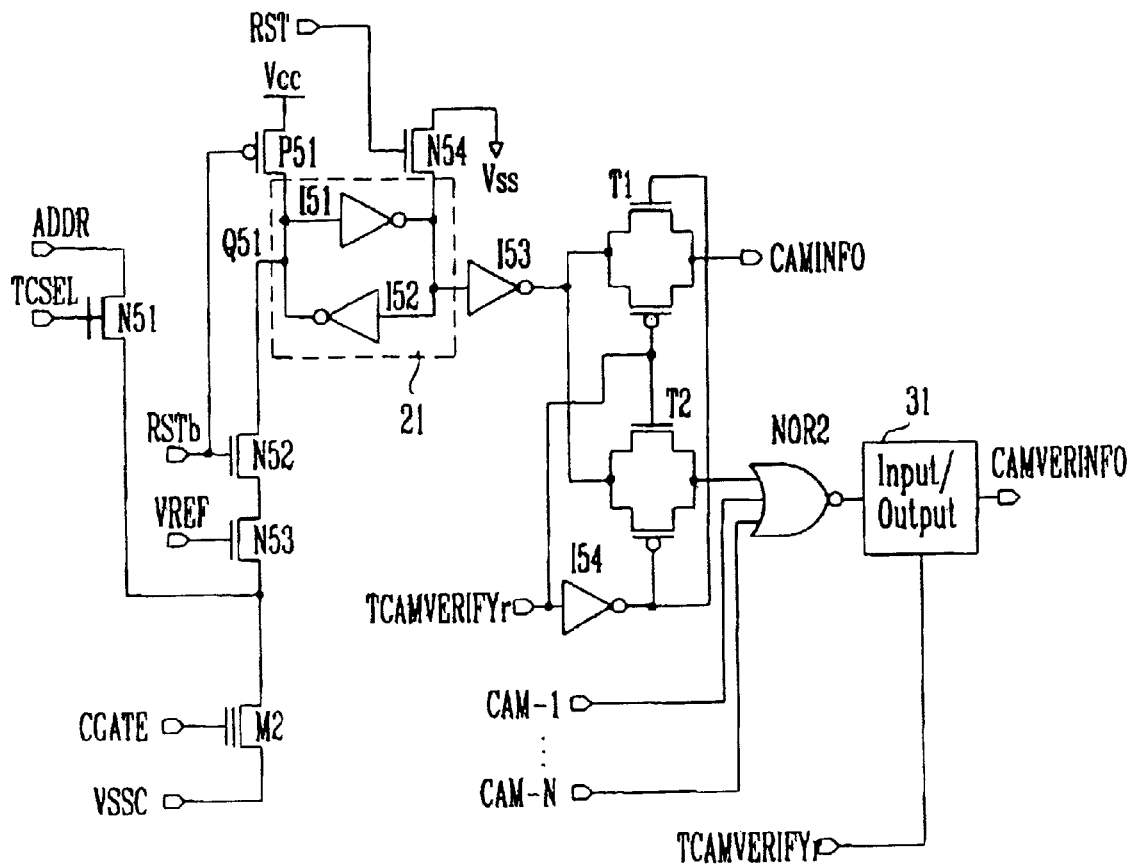
FIG. 9 is a detailed circuit diagram of a circuit to check overerasing of repair fuse cells in accordance with the present invention.

FIG. 9, as a circuit diagram of a circuit to check overerasing of repair fuse cells, is constituted as described in the following.

The first NMOS transistor N51 operates by the fuse cell select signal TCSEL generated in a fuse cell drain bias control signal generator 5, and provides address signals ADDRs to the drain terminal of the fuse cell M2. The second NMOS transistor N52 is connected between a latch circuit 21 and the third NMOS transistor N53, and operates by the inverse reset signal RSTb generated from the power-up reset circuit 1. The third NMOS transistor N53 is connected between the second NMOS transistor N52 and the fuse cell M2. Therefore, the fuse cell gate signal CGATE is entered to a gate terminal and the fifth power VSSC is applied to a source terminal. The first PMOS transistor P51 is connected between a power terminal and a latch circuit 21, and operates by the inverse reset signal RSTb. The latch circuit 21 comprises the first and second inverters I51 and I52; is connected between the first PMOS transistor P51 and the second NMOS transistor N52; and performs data latching. The fourth NMOS transistor N54 is connected between the output terminal of the first inverter I51 and the ground terminal VSS, and operates by the reset signal RST. The output signal of the latch circuit 21, after being inverted by the third inverter I53, is entered to the first and second transmission gates T1 and T2. The fuse cell verify signal TCAMVERIFYr is entered to the PMOS gate of the first transmission gate T1 and to the NMOS gate of the second transmission gate T2. The fuse cell verify signal TCAMVERIFYr inverted by the fourth inverter I54 is entered to the NMOS gate of the first transmission gate T1 and to the PMOS gate of the second transmission gate T2. The output of the first transmission gate T1 is entered to the main memory cell as a fuse cell state signal CAMINFO, and notifies the fuse cell state. The output of the second transmission gate T2 is entered to the NOR gate NOR2 with the fail address signal CAM1 to CAMN, and then logically combined. The output signal of the NOR gate NOR2 is entered to the input/output pad 31 with the fuse cell verify signal TCAMVERIFYr, and notifies the overerasing state with the fuse cell state verify signal CAMVERINFO.

A method driving a circuit to check overerasing of repair fuse cells, constituted in accordance with the present invention, is described in the following.

For read-out operation the fuse cell M2, cell information is sensed by turning on the third NMOS transistor N53 and the fuse cell M2, using the reference voltage (VREF) supplied for a specified time from the repair data sensing delay circuit, and the potential of the fuse cell gate signal CGATE. The inverted reset signal RSTb rises according to supply voltage $V_{CC}$. Since the fuse cell verify signal TCAMVERIFYr keeps low, the fuse cell information is transmitted to the main cell. Namely, fuse cells are read for a specified time T2 in power-up.

Fuse cell M2 programming is performed according to the cell program enable signal TPGMCEN. The fuse cell gate signal CGATE keeps the potential of pumping voltage VPP1 since high voltage is applied through the first power VPPIN and the second power VPPIY at the same time with generating the cell program enable signal TPGMCEN. Also, the fuse cell select signal TCSEL keeps the potential of pumping voltage VPPI, the fifth power VSSC 0V, the inverted reset signal RSTb the high state $V_{CC}$, and 0V is applied as the reference voltage VREF. Thus, an address ADDR for repairing is entered as it is and then supplies voltage Vss is entered to the drain terminal of the fuse cell M2. Thus, programming is performed by hot carrier injection.

The fuse cell M2 is erased by the cell erase enable signal TERACEN. The fuse cell gate signal CGATE keeps the potential of −10V with the cell erase enable signal TERACEN, and is applied to a gate of the cell M2. To the source terminal, 4V is applied by the fifth power VSSC. Also, 0V for the fuse cell select signal TCSEL and the reference voltage VREF is applied and allows the drain terminal of the fuse cell M2 to be floating. Accordingly, erasing is performed to the source terminal over FN tunneling.

A method to check overerasing in accordance with the present invention is described in the following. Checking overerasing is performed by the generated fuse cell verify signal TCAMVERIFYr. Then, the inverse reset signal RSTb is applied at the high state $V_{CC}$, and the reference voltage at the high state 2~3V.

Since the first NMOS transistor N51 is turned off by the fuse cell select signal TCSEL having the low state, the address signal ADDR can not be applied to the drain electrode of the fuse cell M2. The second NMOS transistor N52 is turned on by the high inverse reset signal RSTb, and the third NMOS transistor N53 by the high reference voltage VREF. Thus, to the drain terminal of the fuse cell M2, the voltage reducing, from supply voltage VCC, as much as the gate-source voltage VGS of the second NMOS transistor N52 and the threshold voltage of the second NMOS transistor N52 is applied. Then, 0V is applied to the gate terminal of the fuse cell M2. However, if the fuse cell M2 is overerased, current will flow continuously although 0V is applied to the gate electrode of the fuse cell M2. Accordingly, the potential of the first node Q51 keeps low. The potential of the first node Q51 keeping low is inverted via the first inverter I51 and the second node Q52 gets to the high state. The signal at the high state is inverted to the low state via the third inverter I53, and then applied to the first and second transmission gates T1 and T2. As the fuse cell verify signal TCAMVERIFYr is applied at the high state, however, the second transmission gate T2 is turned on and the potential at the low state is applied to the NOR gate NOR2 by the turned-on gate. To the NOR gate NOR2, each cell state outputted from the above process is entered. Namely, multiple fail address signals CAM1 to CAMN are applied to the NOR gate NOR2. If any one of the signals is applied at the high state, thus output gets to the low state. As the result it is decided that overerasing does not occur. If all fuse cells are overerased, the output of the NOR gate NOR 2 is entered to the input/output pad 31 at the high state. Then the input/output pad 31 decides overerasing of all fuse cells and outputs the results as the fuse cell state verify signal CAMVERINF0.

As described above in accordance with the present invention, since fuse cell erasing for repair may be verified at early stage of testing and early measures are taken for defects that may be detected after testing by several steps, it is possible considerably to reduce production cost.

While the present invention has been described and illustrated herein with reference to the certain preferred embodiment thereof, those skilled in the art will recognize the many modifications and enhancements in form and details which can be made therein without departing from the true spirit and scope of the invention.

What is claimed is:
1. A circuit to check overerasing of repair fuse cells comprising:
a first means to select all repair fuse cells, using a test mode, and to sense each repair fuse cell state depending on the applied read-out voltage;
a second logical means to generate decision signals to decide the overerasing state of said repair fuse cells by logically combining sensed signals from said respective repair fuse cell; and a second means to read the output signals of said logical means.

2. A circuit to check overerasing of repair fuse cells comprising:

a first means to select all repair fuse cells, using a test mode, and to sense each repair fuse cell state depending on the applied read-out voltage;

a second logical means to generate decision signals to decide the overerasing state of said repair fuse cells by logically combining sensed signals from said respective repair fuse cell; and a second means to read the output signals of said logical means; wherein said first means includes:

repair fuse cells;

a switching means to apply address signals selecting said repair fuse cells;

a gate voltage applying means to apply a specified voltage to a gate electrode of said repair fuse cells;

a drain voltage applying means to apply a specified voltage to a drain electrode of said repair fuse cells;

a source voltage applying means to apply a specified voltage to a source electrode of said repair fuse cells;

a latch means temporarily to save the state data of said repair fuse cells;

a first transmission gate to output the output signals of said latch means to the main cell array according to the repair fuse cell test signals; and a second transmission gate to output the output signals of said latch means to said logical means according to said repair fuse cell test signals.

3. The circuit to check overerasing of repair fuse cells of claim 1, wherein said logical means is an NOR gate.

4. The circuit to check overerasing of repair fuse cells of claim 2, wherein said logical means is an NOR gate.

5. A flash memory device having associated therewith a plurality of repair fuse cell blocks including at least one repair fuse cell overerasing checking circuit, said at least one repair fuse cell overerasing checking circuit comprising:

first means to select all repair fuse cells, using a test mode, and to sense each repair fuse cell state depending on the applied read-out voltage;

a second logical means to generate decision signals to decide the overerasing state of said repair fuse cells by logically combining sensed signals from said respective repair fuse cell; and second means to read the output signals of said logical means.

6. The flash memory device according to claim 5, wherein said first means includes:

repair fuse cells;

a switching means to apply address signals selecting said repair fuse cells;

a gate voltage applying means to apply a specified voltage to a gate electrode of said repair fuse cells;

a drain voltage applying means to apply a specified voltage to a drain electrode of said repair fuse cells;

a source voltage applying means to apply a specified voltage to a source electrode of said repair fuse cells;

a latch means temporarily to save the state data of said repair fuse cells;

a first transmission gate to output the output signals of said latch means to the main cell array according to the repair fuse cell test signals; and a second transmission gate to output the output signals of said latch means to said logical means according to said repair fuse cell test signals.

7. The flash memory device according to claim 5, wherein said logical means is an NOR gate.

* * * * *